US012603663B2

(12) United States Patent
Jiang et al.

(10) Patent No.: US 12,603,663 B2
(45) Date of Patent: Apr. 14, 2026

(54) DUAL-BAND RF MIXER CHAIN USING DUAL-BAND MATCHING NETWORK AND SHARED LOCAL OSCILLATOR

(71) Applicant: Apple Inc., Cupertino, CA (US)

(72) Inventors: Haowei Jiang, San Diego, CA (US); Ming-Da Tsai, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 612 days.

(21) Appl. No.: 17/946,739

(22) Filed: Sep. 16, 2022

(65) Prior Publication Data

US 2024/0097716 A1 Mar. 21, 2024

(51) Int. Cl.
H04B 1/00 (2006.01)
H03H 7/38 (2006.01)

(52) U.S. Cl.
CPC ............. H04B 1/0064 (2013.01); H03H 7/38 (2013.01); H04B 1/0082 (2013.01)

(58) Field of Classification Search
CPC .. H04B 1/0064; H04B 1/0082; H04B 1/0078; H04B 1/0085; H03H 7/38; H03H 7/383
See application file for complete search history.

(56) References Cited

U.S. PATENT DOCUMENTS

2013/0148636 A1 6/2013 Lum et al.
2013/0316670 A1* 11/2013 Tasic .......................... H03F 3/68
455/234.1

(Continued)

FOREIGN PATENT DOCUMENTS

WO 2013177555 A1 11/2013
WO 2015123368 A1 8/2015
WO 2015179172 A1 11/2015

OTHER PUBLICATIONS

Ashutosh Verma et al., "A 16-Channel, 28/39GHz Dual-Polarized 5G FR2 Phased-Array Transceiver IC with a Quad-Stream IF Transceiver Supporting Non-Contiguous Carrier Aggregation up to 1.6GHz BW," ISSCC 2022 / Session 27 / mm-WAVE & Sub-6GHZ Receivers and Transceivers for 5G Radios / 27.1, Mar. 16, 2022, pp. 1-3.

(Continued)

*Primary Examiner* — John J Lee
(74) *Attorney, Agent, or Firm* — FLETCHER YODER PC

(57) ABSTRACT

This case is directed to supporting LB/LB, LB/MB, LB/HB and MB/HB carrier aggregation while reducing the area consumed on a transceiver and reducing power consumed on the transceiver. In some cases, four supporting such carrier aggregation may include implementing four separate radio frequency mixer chains. However, implementing four separate mixer chains may consume excessive area on the transceiver and may result in excessive transceiver power consumption. By leveraging the fact that HB LO frequency ranges overlap with LB LO frequency ranges, a dual-band gain stage may be implemented such that an LB/HB mixer may share a single LO signal (e.g., so as to provide a dual-band matching network that may provide impedance matching at LB and HB frequencies) without extending an original LB LO signal bandwidth. The dual-band gain stage may reduce space and power consumed on the transceiver while maintaining support for LB/LB, LB/MB, LB/HB and MB/HB carrier aggregation.

20 Claims, 15 Drawing Sheets

(56) References Cited

U.S. PATENT DOCUMENTS

| 2015/0341007 A1* | 11/2015 | Youssef | H03F 3/68 |
| | | | 330/278 |
| 2019/0020316 A1* | 1/2019 | Cheng | H01P 5/028 |
| 2022/0311469 A1 | 9/2022 | Brunel et al. | |

OTHER PUBLICATIONS

Li Gao et al., A 20-44-GHz Image-Rejection Receiver With >75-dB Image-Rejection Ratio in 22-nm CMOS FD-SOI for 5G Applications, IEEE Transactions on Microwave Theory and Techniques, Mar. 2020.

* cited by examiner

500

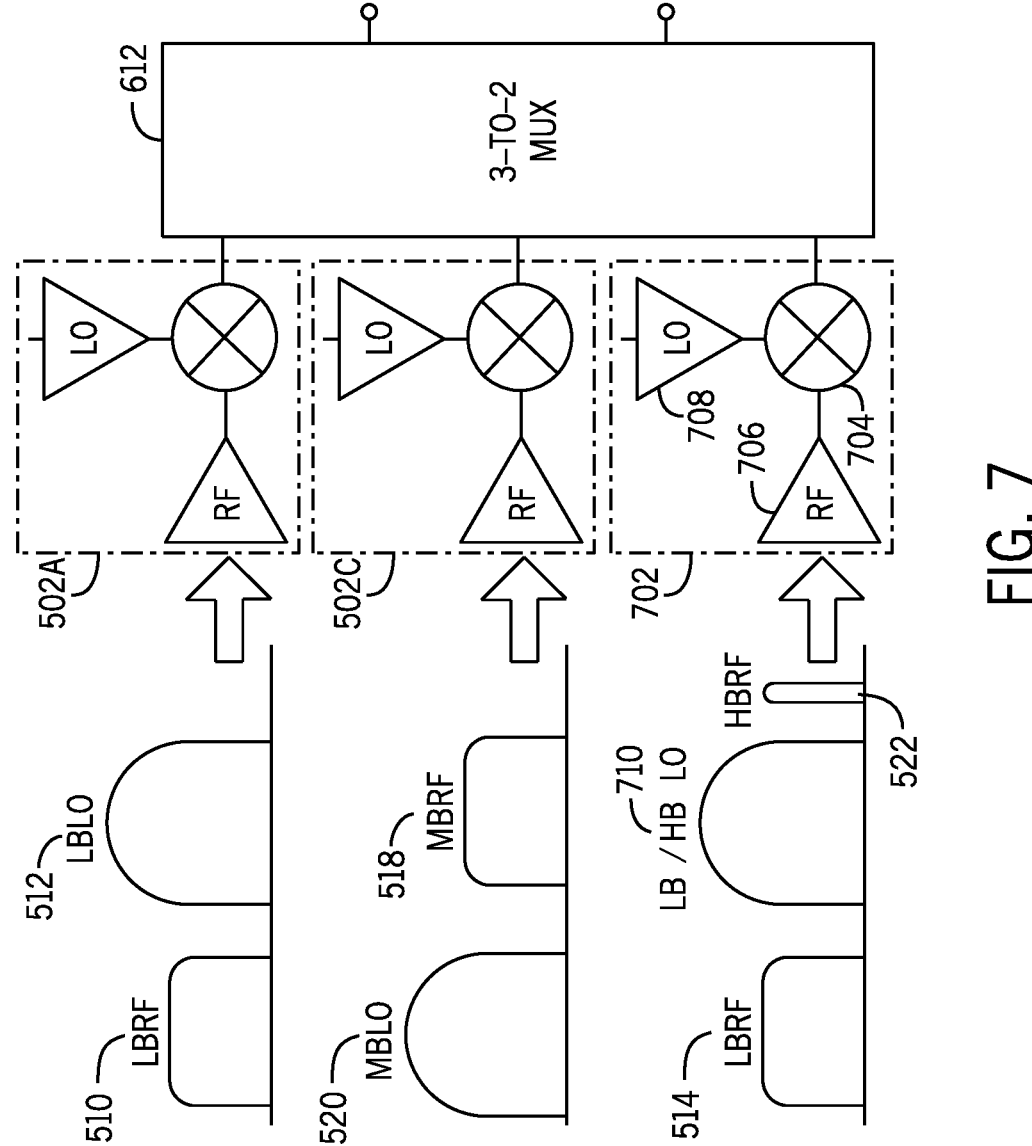
FIG. 7

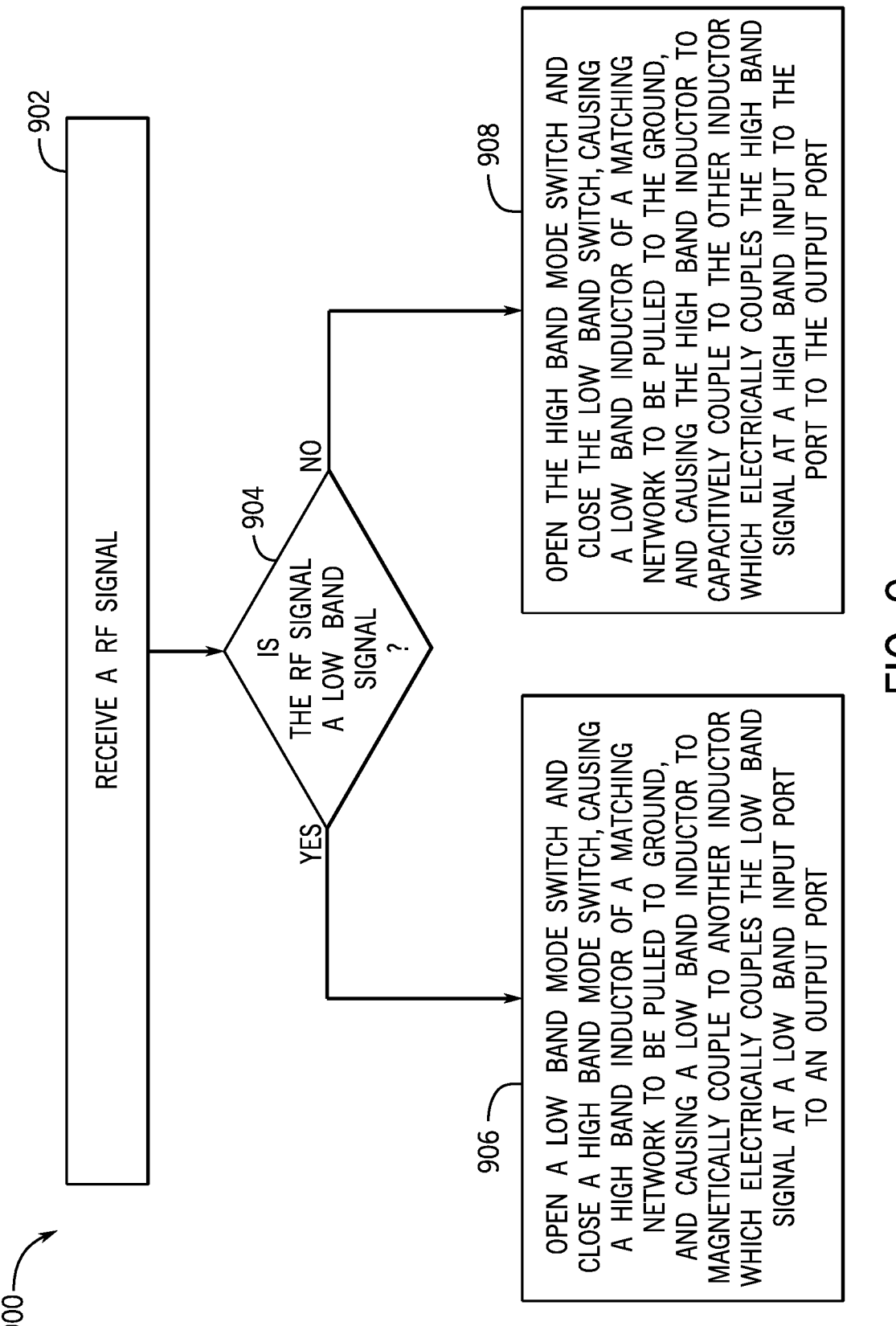

RECEIVE A RF SIGNAL

904

IS THE RF SIGNAL A LOW BAND SIGNAL ?

YES

NO

906

OPEN A LOW BAND MODE SWITCH AND CLOSE A HIGH BAND MODE SWITCH, CAUSING A HIGH BAND INDUCTOR OF A MATCHING NETWORK TO BE PULLED TO GROUND, AND CAUSING A LOW BAND INDUCTOR TO MAGNETICALLY COUPLE TO ANOTHER INDUCTOR WHICH ELECTRICALLY COUPLES THE LOW BAND SIGNAL AT A LOW BAND INPUT PORT TO AN OUTPUT PORT

908

OPEN THE HIGH BAND MODE SWITCH AND CLOSE THE LOW BAND MODE SWITCH, CAUSING A LOW BAND INDUCTOR OF A MATCHING NETWORK TO BE PULLED TO THE GROUND, AND CAUSING THE HIGH BAND INDUCTOR TO CAPACITIVELY COUPLE TO THE OTHER INDUCTOR WHICH ELECTRICALLY COUPLES THE HIGH BAND SIGNAL AT A HIGH BAND INPUT TO THE PORT TO THE OUTPUT PORT

900

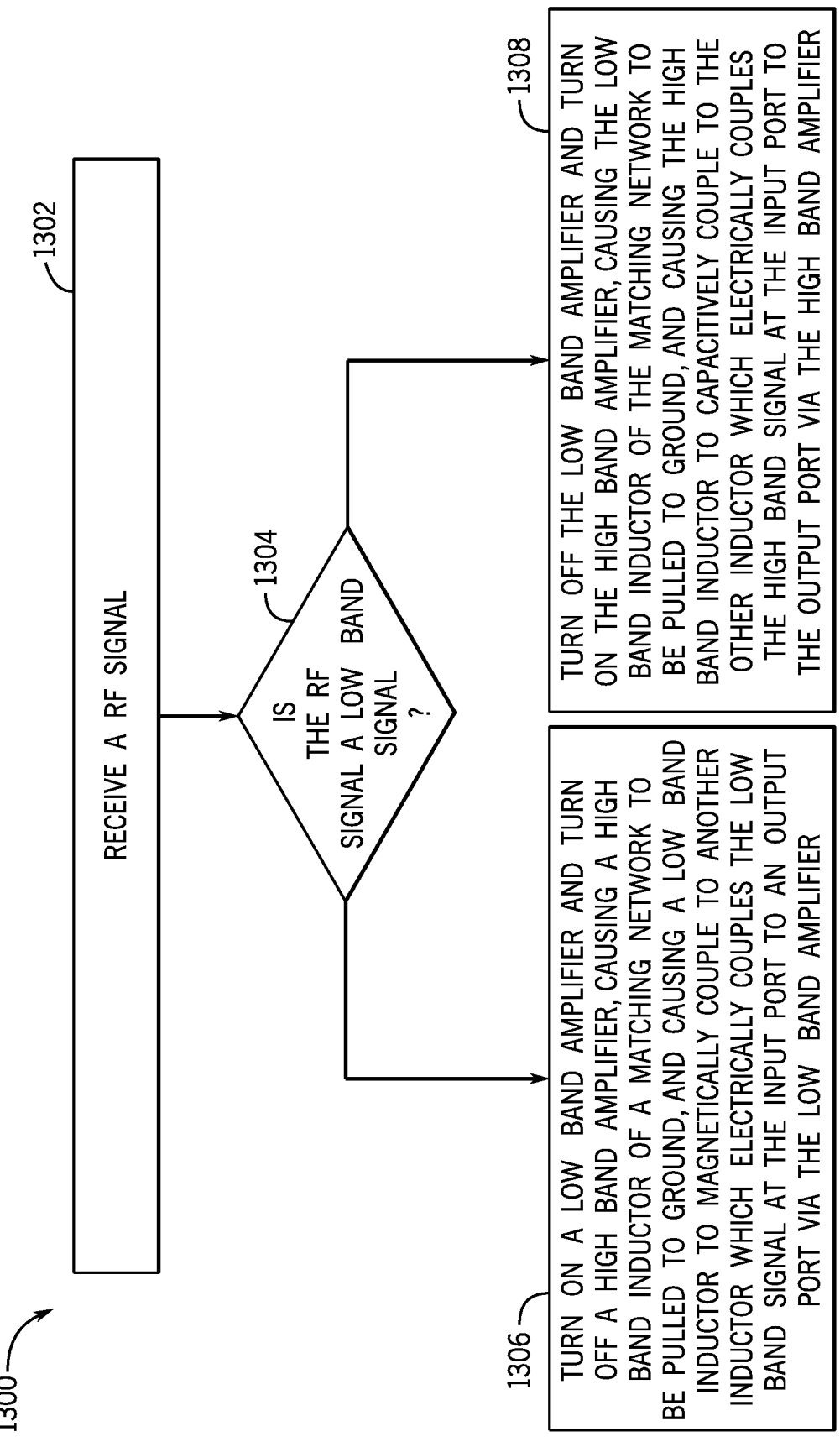

1300

1302

RECEIVE A RF SIGNAL

1304

IS THE RF SIGNAL A LOW BAND SIGNAL ?

1306

TURN ON A LOW BAND AMPLIFIER AND TURN OFF A HIGH BAND AMPLIFIER, CAUSING A HIGH BAND INDUCTOR OF A MATCHING NETWORK TO BE PULLED TO GROUND, AND CAUSING A LOW BAND INDUCTOR TO MAGNETICALLY COUPLE TO ANOTHER INDUCTOR WHICH ELECTRICALLY COUPLES THE LOW BAND SIGNAL AT THE INPUT PORT TO AN OUTPUT PORT VIA THE LOW BAND AMPLIFIER

1308

TURN OFF THE LOW BAND AMPLIFIER AND TURN ON THE HIGH BAND AMPLIFIER, CAUSING THE LOW BAND INDUCTOR OF THE MATCHING NETWORK TO BE PULLED TO GROUND, AND CAUSING THE HIGH BAND INDUCTOR TO CAPACITIVELY COUPLE TO THE OTHER INDUCTOR WHICH ELECTRICALLY COUPLES THE HIGH BAND SIGNAL AT THE INPUT PORT TO THE OUTPUT PORT VIA THE HIGH BAND AMPLIFIER

FIG. 13

DUAL-BAND RF MIXER CHAIN USING DUAL-BAND MATCHING NETWORK AND SHARED LOCAL OSCILLATOR

BACKGROUND

The present disclosure relates generally to wireless communication, and more specifically to regulating transmitter output power.

In an electronic device, a transmitter may be coupled to one or more antennas to enable the electronic device to transmit wireless signals. In some communication applications, a transmit power level of the transmitter may be adjusted (e.g., switched from a low power mode to a high power mode or vice versa) repeatedly over a short time period (e.g., with each subsequent transmitted symbol) to output a transmission signal at a desired power. However, if the power level is not switched to a desired power level within an interval between a symbol and the subsequent symbol, the transmission signal may be distorted.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a transceiver may include a mixer; a local oscillator; and a gain stage coupled to the mixer. The gain stage may include an input port that may receive a signal, and a matching network that may electrically couple the input port to a first amplifier or a second amplifier. The matching network may include a first inductor, a second inductor that may couple to the first inductor based on the signal including a first frequency, and a third inductor that may couple to the first inductor based on the signal including a second frequency.

In another embodiment, a method may include receiving a signal at a receiver of an electronic device, magnetically coupling a first inductor of a gain stage of the electronic device to a second inductor of the gain stage based on the signal including a first frequency; electrically coupling an input of the gain stage to a first amplifier of the gain stage based on the signal including the first frequency; capacitively coupling a first terminal of a third inductor of the gain stage to a second terminal of the second inductor based on the signal including a second frequency; and electrically coupling the input to a second amplifier of the gain stage based on the signal including the second frequency.

In yet another embodiment, a device may include an input configured to receive a signal; a first inductor electrically coupled to the input; a second inductor electrically coupled to a first amplifier and configured to magnetically couple to the first inductor based on the signal including a first frequency; and a third inductor electrically coupled to a second amplifier, a first terminal of the third inductor configured to capacitively couple to a second terminal of the first inductor based on the signal including a second frequency.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

FIG. 7 is a diagram of a carrier aggregation circuitry having a reduced number of RF mixer chains by combining an LB mixer chain and an HB mixer chain while maintaining support for LB/LB, LB/MB, LB/HB, and MB/HB carrier aggregation, according to embodiments of the present disclosure;

FIG. 9 is a flowchart of a method for operating the RF gain stage of FIG. 8 in a LB mode or an HB mode, according to embodiments of the disclosure;

FIG. 13 is a flowchart of a method for operating the RF gain stage of FIG. 12 in a LB mode or an HB mode, according to embodiments of the disclosure;

DETAILED DESCRIPTION OF SPECIFIC EMBODIMENTS

Figure 1:
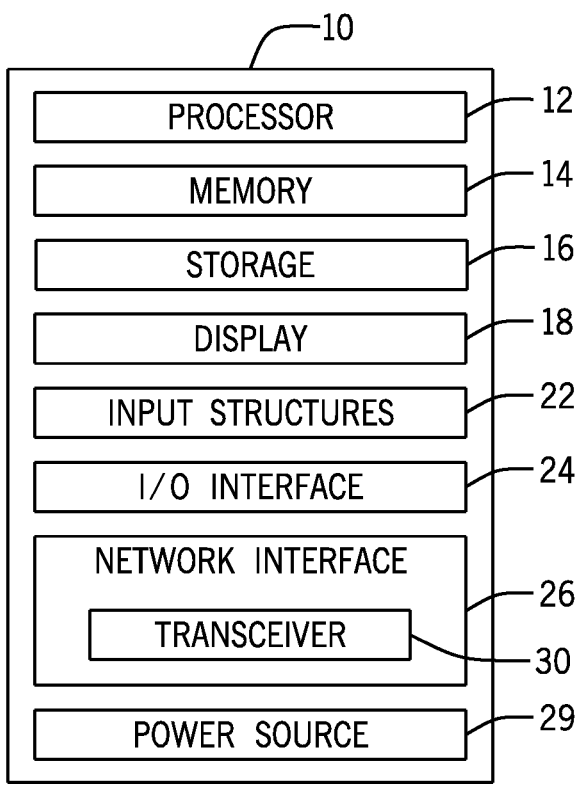
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

The 5th Generation (5G) New Radio (NR) standard has rapidly evolved to cover a wide range of frequencies (e.g., 24 gigahertz (GHz) to 50 GHz) with emerging interband carrier aggregation support. Carrier aggregation may include various combinations of carriers in a low band (LB) (e.g., ranging from 24 GHz to 30 GHz, such as ranging from 24.25 GHz-27.5 GHz, from 26.5 GHz-29.5 GHz, and from 27.5 GHz-28.35 GHz), a mid-band (MB) (e.g., ranging from 37 GHz-40 GHz and from 39.5 GHz-43.5 GHz) and a high band (HB) (e.g., above 47 GHz, such as ranging from 47.2 GHz-48.2 GHz). The combinations may include pairs of component carriers each corresponding to the LB range, the MB range, or the HB range. The LB frequency range may be separated from the HB frequency range by 25 GHz (e.g., 20 GHz or less, 15 GHz or less, 10 GHz or less, 5 GHz or less, and so on). Because hardware (e.g., filtering circuitry) and/or software components may be added to support each additional transmission or receive frequency range, including that for each component carrier, it may become increasingly challenging to provide different combinations of interband carrier aggregation support while maintaining sufficiently small die area and sufficiently low power consumption.

In some cases, to support LB/LB, LB/MB, LB/HB, and MB/HB carrier aggregation, four separate radio frequency (RF) mixer chains may be implemented on a transceiver. An RF mixer chain may upconvert a non-RF (e.g., baseband or intermediate) frequency signal to an RF signal (e.g., in the case of transmission), or downconvert an RF signal to a non-RF frequency signal (e.g., in the case of reception). As such, an RF mixer chain may include a gain stage, an RF mixer, and a local oscillator (LO). However, implementing four separate RF mixer chains may consume excessive area on the transceiver and may result in excessive transceiver power consumption. Therefore, it may be beneficial to design a circuit that has less RF mixer chains, and thus less components, that supports high efficiency dual-band operation and may provide enhanced image rejection capabilities.

By leveraging dual-band circuitry (e.g., a dual-band mixer) that enables overlap between HB LO frequency ranges and LB LO frequency ranges, a dual-band gain stage may be implemented such that an LB/HB mixer may share a single LO signal (e.g., so as to provide a dual-band matching network that may provide impedance matching at LB and HB frequencies) without extending an original LB LO signal bandwidth. To achieve the dual-band circuitry, LB may use high-side injection, HB may use low-side injection, and an intermediate frequency (IF) may be selected to enable a common LO frequency between the HB LO frequency ranges and the LB LO frequency ranges. The dual-band gain stage may reduce space and power consumed on the transceiver while maintaining support for LB/LB, LB/MB, LB/HB and MB/HB carrier aggregation.

The dual-band matching network of the dual-band gain stage includes a three coil (e.g., including three coupled inductors) transformer topology that may have reduced or minimal gain error on the dual-band gain stage and may include noise rejection capabilities. In some embodiments, the dual-band gain stage may be implemented with separated LB and HB input ports (e.g., in the case that the LB and HB inputs are sent to or received from separate antennas, low-noise amplifiers (LNAs), variable gain amplifiers (VGAs), power amplifiers (PAs), and so on). In other embodiments, the dual-band gain stage may be implemented with a shared LB and HB input port (e.g., if the LB and HB inputs are sent to or received from a common antenna, LNA, VGA, PA, and so on).

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network, a $6^{th}$ generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mm-Wave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
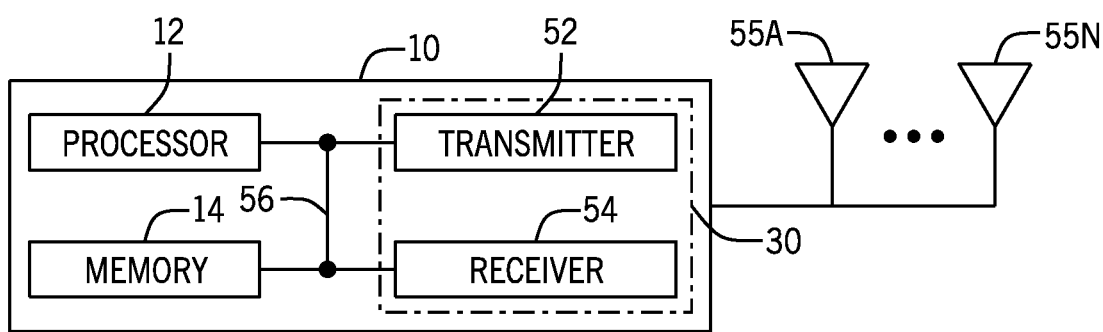
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive signals between one another.

The electronic device 10 may include the transmitter 52 and/or the receiver 54 that respectively enable transmission and reception of signals between the electronic device 10 and an external device via, for example, a network (e.g., including base stations or access points) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with one or more beams and various configurations. In some embodiments, multiple antennas of the antennas 55A-55N of an antenna group or module may be communicatively coupled to a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figures 3, 4:
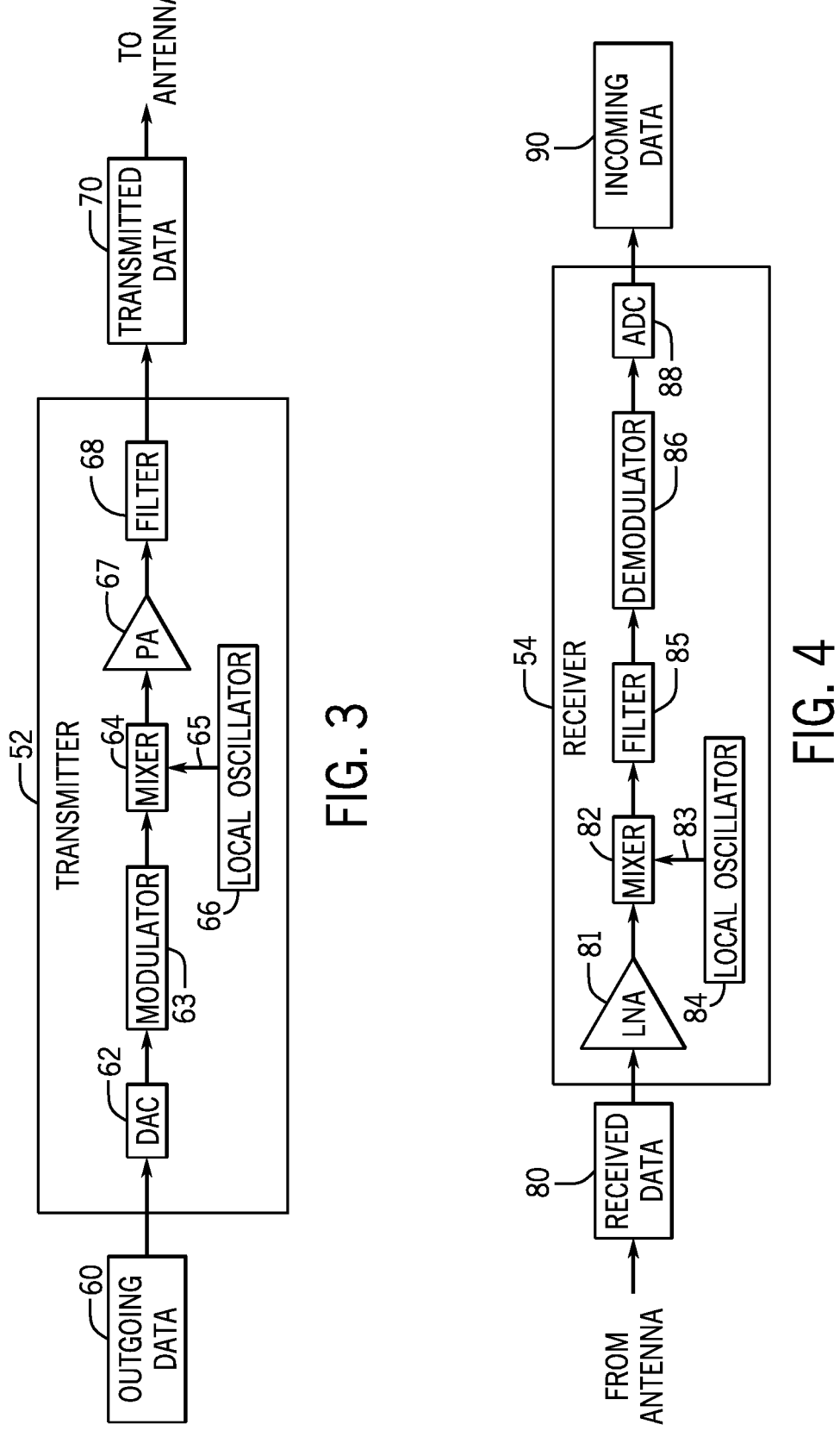
FIG. 3 is a schematic diagram of a transmitter of the electronic device of FIG. 1, according to embodiments of the present disclosure.
FIG. 4 is a schematic diagram of a receiver of the electronic device of FIG. 1, according to embodiments of the present disclosure.

As mentioned above, the transceiver 30 of the electronic device 10 may include a transmitter and a receiver that are coupled to at least one antenna to enable the electronic device 10 to transmit and receive wireless signals. FIG. 3 is a block diagram of a transmitter 52 (e.g., transmit circuitry) that may be part of the transceiver 30, according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 63 may combine the converted analog signal with a carrier signal. A mixer 64 may combine the carrier signal with a local oscillator signal 65 (which may include quadrature component signals) from a local oscillator 66 to generate a radio frequency signal. A power amplifier (PA) 67 receives the radio frequency signal from the mixer 64, and may amplify the modulated signal to a suitable level to drive transmission of the signal via the one or more antennas 55. A filter 68 (e.g., filter circuitry and/or software) of the transmitter 52 may then remove undesirable noise from the amplified signal to generate transmitted data 70 to be transmitted via the one or more antennas 55. The filter 68 may include any suitable filter or filters to remove the undesirable noise from the amplified signal, such as a bandpass filter, a bandstop filter, a low pass filter, a high pass filter, and/or a decimation filter. Additionally, the transmitter 52 may include any suitable additional components not shown, or may not include certain of the illustrated components, such that the transmitter 52 may transmit the outgoing data 60 via the one or more antennas 55. For example, the transmitter 52 may include an additional mixer and/or a digital up converter (e.g., for converting an input signal from a baseband frequency to an intermediate frequency). As another example, the transmitter 52 may not include the filter 68 if the power amplifier 67 outputs the amplified signal in or approximately in a desired frequency range (such that filtering of the amplified signal may be unnecessary).

FIG. 4 is a schematic diagram of a receiver 54 (e.g., receive circuitry) that may be part of the transceiver 30, according to embodiments of the present disclosure. As illustrated, the receiver 54 may receive received data 80 from the one or more antennas 55 in the form of an analog signal. A low noise amplifier (LNA) 81 may amplify the received analog signal to a suitable level for the receiver 54 to process. A mixer 82 may combine the amplified signal with a local oscillator signal 83 (which may include quadrature component signals) from a local oscillator 84 to generate an intermediate or baseband frequency signal. A filter 85 (e.g., filter circuitry and/or software) may remove undesired noise from the signal, such as cross-channel interference. The filter 85 may also remove additional signals received by the one or more antennas 55 that are at frequencies other than the desired signal. The filter 85 may include any suitable filter or filters to remove the undesired noise or signals from the received signal, such as a bandpass filter, a bandstop filter, a low pass filter, a high pass filter, and/or a decimation filter. A demodulator 86 may remove a radio frequency envelope and/or extract a demodulated signal from the filtered signal for processing. An analog-to-digital converter (ADC) 88 may receive the demodulated analog signal and convert the signal to a digital signal of incoming data 90 to be further processed by the electronic device 10. Additionally, the receiver 54 may include any suitable additional components not shown, or may not include certain of the illustrated components, such that the receiver 54 may receive the received data 80 via the one or more antennas 55. For example, the receiver 54 may include an additional mixer and/or a digital down converter (e.g., for converting an input signal from an intermediate frequency to a baseband frequency).

Figure 5:
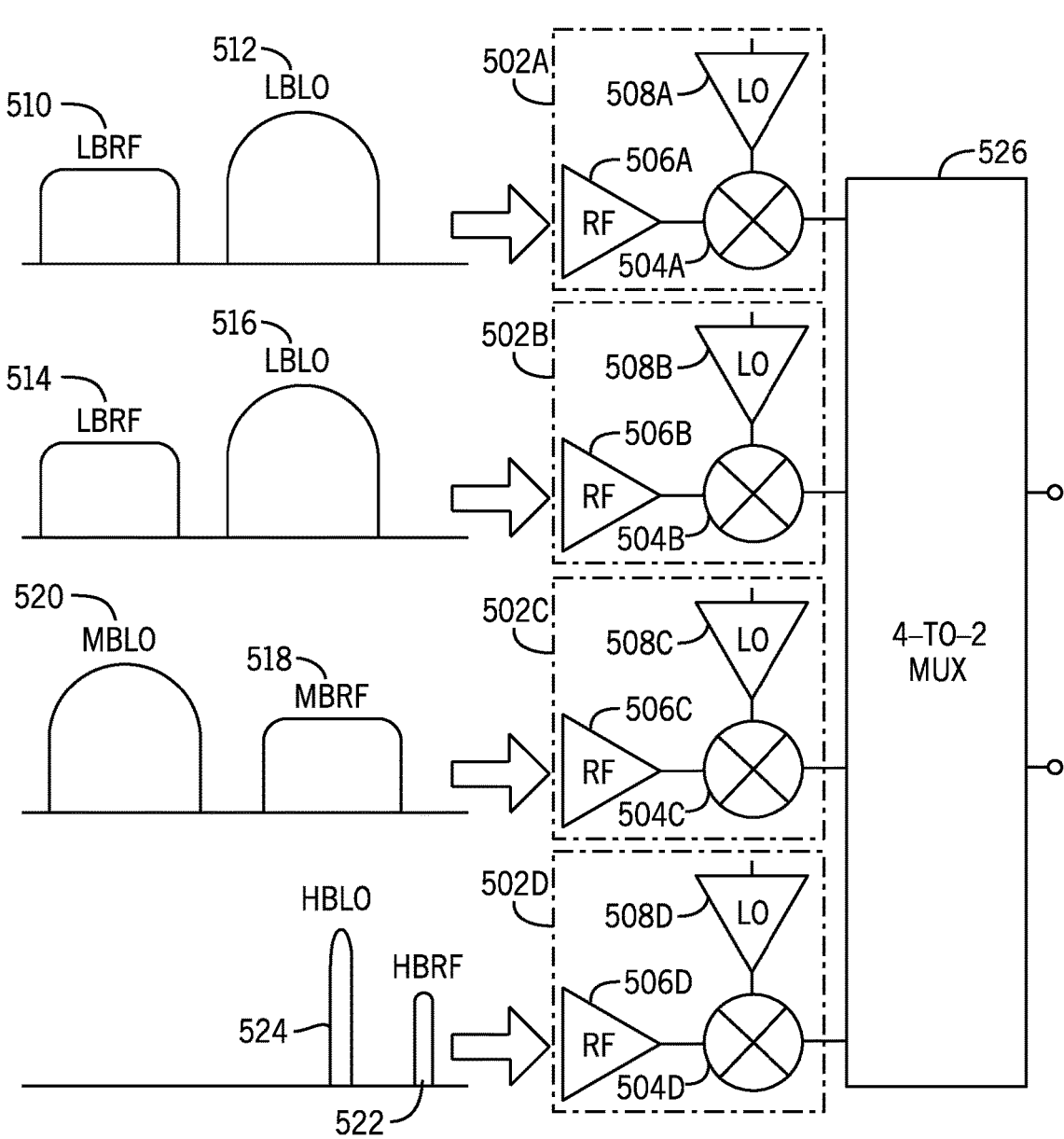
FIG. 5 is a diagram of carrier aggregation circuitry having four separate radio frequency (RF) mixer chains to support low band (LB)/LB, LB/midband (MB), LB/high band (HB) and MB/HB carrier aggregation.

FIG. 5 is a diagram illustrating implementation of four separate radio frequency (RF) mixer chains in carrier aggregation circuitry 500 to support LB/LB, LB/MB, LB/HB and MB/HB carrier aggregation. The carrier aggregation circuitry 500 may be included in the transmitter 52 and/or the receiver 54. Each mixer chain 502A, 502B, 502C, and 502D (collectively the mixer chains 502) includes an RF mixer 504A, 504B, 504C, and 504D (collectively the RF mixers 504), a gain stage 506A, 506B, 506C, and 506D (collectively the gain stages 506) and a local oscillator (LO) 508A, 508B, 508C, and 508D (collectively, the LOs 508), respectively. The mixer chain 502A receives a low band radio frequency signal (LBRF signal 510) and a low band local oscillation signal (LBLO signal 512) to provide LB component carriers. The mixer chain 502B receives another LBRF signal 514 and another LBLO signal 516 to provide other LB component carriers (e.g., LB components carriers having a different frequency range than the component carriers associated with the mixer chain 502A). The mixer chain 502C receives a mid-band radio frequency (MBRF signal 518) and a mid-band local oscillation signal (MBLO signal 520) to provide MB component carriers. The mixer chain 502D receives a high band radio frequency (HBRF signal 522) and a high band local oscillation signal (HBLO signal 524) to provide HB component carriers.

The carrier aggregation circuitry 500 includes a multiplexer 526 (e.g., a 4-to-2 multiplexer) that may receive carrier components from two or more of the mixer chains 502. The multiplexer 526 may select two RF signals from the mixer chains 502 and combine them to perform carrier aggregation (e.g., to increase data rate of RF signals). For example, selecting, via the multiplexer 526, the signals from the mixer chain 502A and the mixer chain 502B may provide LB/LB carrier aggregation, while selecting the signals from the mixer chain 502C and 502D may provide MB/HB carrier aggregation. While the carrier aggregation circuitry 500 may enable LB/LB, LB/MB, LB/HB, and MB/HB carrier aggregation, implementing the four separate mixer chains 502 may consume excessive area on the transceiver 30 and may result in excessive transceiver power consumption. Therefore, it may be beneficial to design a circuit to support high efficiency dual-band operation that may provide enhanced image rejection capabilities.

Figure 6:
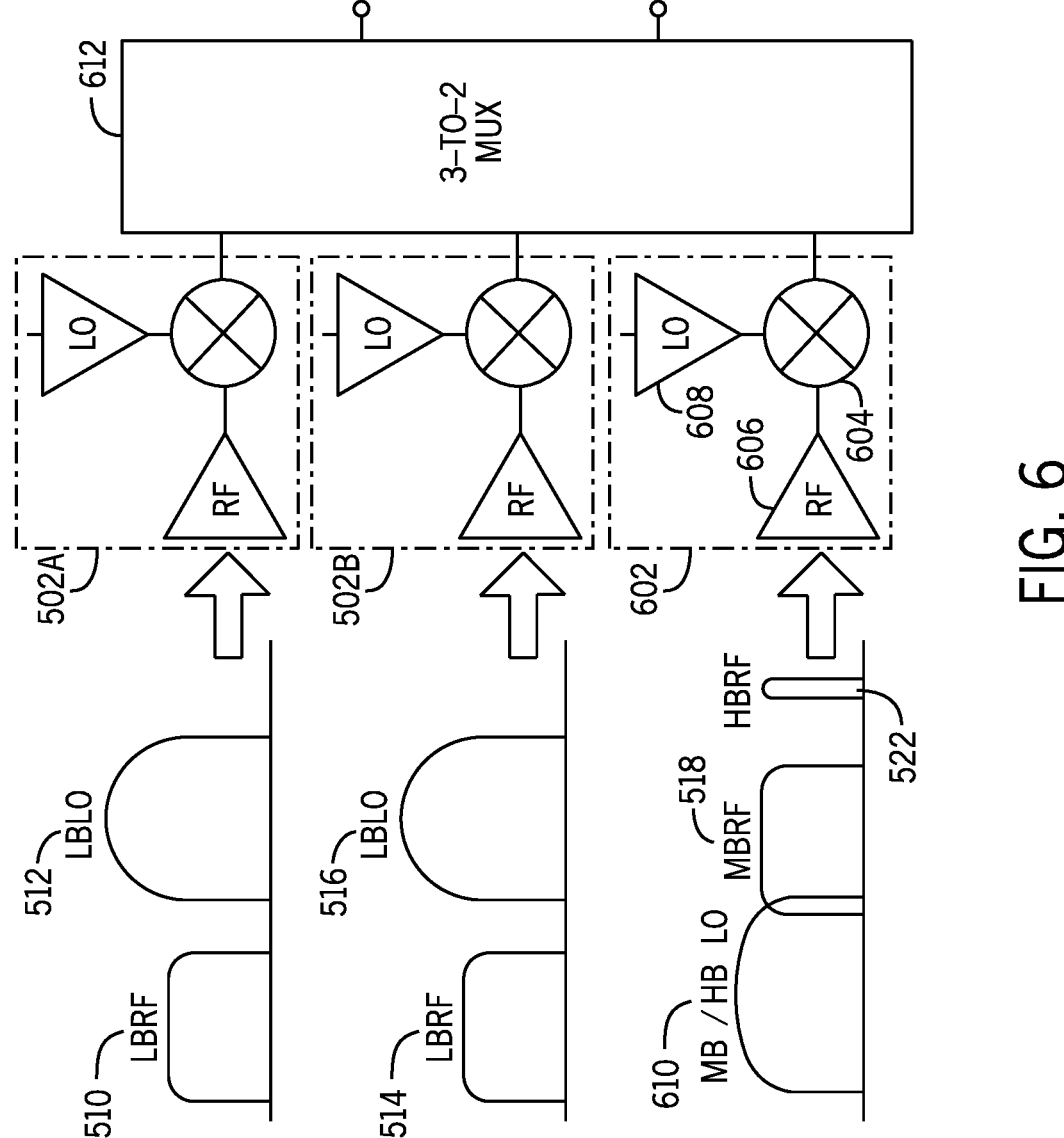
FIG. 6 is a diagram of carrier aggregation circuitry having a reduced number of RF mixer chains by combining an MB mixer chain and an HB mixer chain.

In some cases, carrier aggregation circuitry may enable receiving multiple frequency bands in a single mixer chain. FIG. 6 is a diagram of carrier aggregation circuitry 600 having a reduced number of RF mixer chains by combining an MB mixer chain (e.g., 502C) and an HB mixer chain (e.g., 502D). The carrier aggregation circuitry 600 may include the mixer chain 502A and the mixer chain 502B discussed with respect to FIG. 5 as well as a mixer chain 602. The mixer chain 602 includes an RF mixer 604, a gain stage 606 and a local oscillator 608. The mixer chain 602 may receive both the MBRF signal 518 and HBRF signal 522. The mixer chain 602 may receive a combination MB and HB local oscillator signal (MB/HB LO signal 610). The carrier aggregation circuitry 600 may include a multiplexer 612 (e.g., a 3-to-2 multiplexer) that may receive carrier components from the three mixer chains 502A, 502B, and 602. The multiplexer 612 may select two RF signals from the mixer chains 502A, 502B, and 602 and combine them to perform carrier aggregation (e.g., to increase data rate of an RF signal).

However, by integrating the mixer chain 502C (e.g., the MB mixer chain) and the mixer chain 502D (e.g., the HB mixer chain) into the mixer chain 602, the MB/HB LO signal 610 may correspond to LO buffer circuitry that may include a greater bandwidth than the MBLO signal 520 or the HBLO signal 524 individually, as there may be little or no overlap between the MBLO signal 520 and the HBLO signal 524. For example, the MB/HB LO signal 610 may include a frequency range greater than or equal to 14.5 GHZ, which may consume excessive power on the transceiver 30. Moreover, as may be observed from the mixer chain 602, the MB/HB LO signal 610 may overlap with, and consequently cause interference on, the MBRF signal 518. Additionally, the carrier aggregation circuitry 600 may not support MB/HB carrier aggregation, as the mixer chain 602 may not support the MBRF signal 518 and the HBRF signal 522 operating on the same hardware at the same time (e.g., due to a phase difference between the MBRF signal 518 and the HBRF signal 522). As such, it may be advantageous to implement carrier aggregation circuitry that may utilize a LO signal of smaller bandwidth (e.g., to reduce power consumption and to prevent interference on one or more RF signals) while maintaining support for LB/LB, LB/MB, LB/HB, and MB/HB carrier aggregation.

FIG. 7 is a diagram of a carrier aggregation circuitry 700 having a reduced number of RF mixer chains by combining an LB mixer chain (e.g., 502B) and an HB mixer chain (e.g., 502D) while maintaining support for LB/LB, LB/MB, LB/HB, and MB/HB carrier aggregation, according to embodiments of the present disclosure. The carrier aggregation circuitry 700 includes the mixer chain 502A and the mixer chain 502C discussed with respect to FIG. 5 as well as a mixer chain 702. The mixer chain 702 may integrate the LB mixer chain 502B and the HB mixer chain 502D. In particular, the mixer chain 702 may include an RF mixer 704, a gain stage 706 and a local oscillator 708. The mixer chain 702 may receive both the LBRF signal 514 and HBRF signal 522. The mixer chain 702 may receive a combination LB and HB local oscillator signals (LB/HB LO signal 710). The carrier aggregation circuitry 700 may include the multiplexer 612 (e.g., a 3-to-2 multiplexer) that may receive carrier components from the three mixer chains 502A, 502C, and 702.

As there may be frequency overlap between the LBLO signal 516 and the HBLO signal 524 when LB is using high-side injection (e.g., LBLO signal 516 is the sum of the LBRF signal 514 and an intermediate frequency (IF)) and the HB is using low-side injection (e.g., the LBLO signal 516 is the difference between the HBRF signal 522 and the IF), the LB/HB LO signal 710 may have the same or a similar bandwidth as the LBLO signal 516 and the HBLO signal 524 (e.g., the LB/HB LO signal 710 may have a bandwidth less than or equal to 10 GHz), which may offer a power reduction from the MB/HB LO signal 610. The smaller bandwidth of the LB/HB LO signal 710 may also prevent the LB/HB LO signal 710 from overlapping (e.g., and may therefore may prevent interference) with the LBRF signal 514 and the HBRF signal 522. Moreover, the mixer chain 702 may support the LBRF signal 514 and the HBRF signal 522 operating on the same hardware, enabling the carrier aggregation circuitry 700 to support LB/LB, LB/MB, LB/HB, and MB/HB carrier aggregation. For example, to enable LB+HB carrier aggregation, the mixer chain 702 may operate in HB mode while the mixer chain 502A may operate at the same time. And, as another example, to enable LB+LB carrier aggregation, 702 may operate in LB mode while the mixer chain 502A may operate at the same time.

As such, by integrating the mixer chain 502B (e.g., the LB mixer chain) with the mixer chain 502D (the HB mixer chain), the carrier aggregation circuitry 700 may provide support for LB/LB, LB/MB, LB/HB, and MB/HB carrier aggregation while reducing power consumption and size of the carrier aggregation circuitry on the transceiver 30, reducing or eliminating interference between the LO signal and the RF signals on the shared mixer chain 702. It should be noted that while the discussion with respect to FIG. 7 mentions integrating the LB mixer chain 502B into the mixer chain 702, the carrier aggregation circuitry 700 may, in some embodiments, integrate any LB mixer chain (e.g., 502A) into the mixer chain 702.

Figure 8:
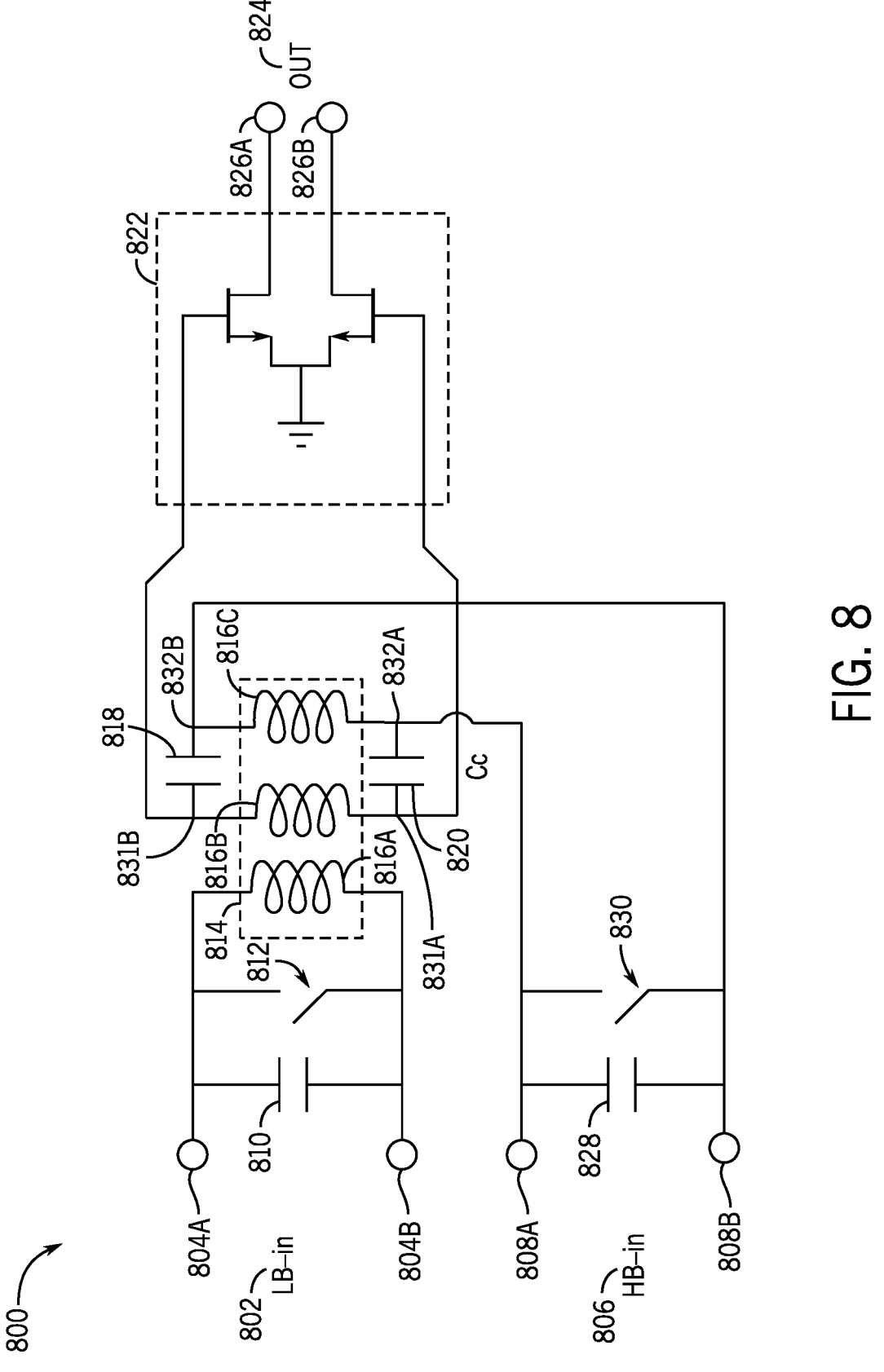
FIG. 8 is a schematic diagram of a dual-input port dual-band RF gain stage that may implement the carrier aggregation discussed with respect to FIG. 7, according to embodiments of the present disclosure.

FIG. 8 is a schematic diagram of a dual-input port dual-band RF gain stage 800 that may implement the carrier aggregation discussed with respect to FIG. 7, according to embodiments of the present disclosure. The RF gain stage 800 may be implemented in a dual-band mixer chain (e.g., at the RF gain stage 706 of the mixer chain 702). In some embodiments, more than one RF gain stage 800 may be coupled to one another, cascaded, or implemented in a row (e.g., such that the output of one RF gain stage 800 feeds into an input of a subsequent RF gain stage 800). The RF gain stage 800 includes a low band (LB) input port 802 (e.g., including differential inputs 804A and 804B) and a high band (HB) input port 806 (e.g., including differential inputs 808A and 808B). The RF gain stage 800 may include the separate input ports 802 and 806 when, for example, the LBRF signal 514 and the HBRF signal 522 are received from separate antennas or amplifiers (LNAs, VGAs, PAs, and so on). The RF gain stage 800 may include a capacitor 810 coupled to the LB input port 802, an LB switch 812 coupled in parallel to the capacitor 810, and an inductor 816A (e.g., an LB inductor) coupled in parallel to the LB switch 812 and the capacitor 810. The RF gain stage 800 may include an inductor 816B configured to magnetically couple to the inductor 816A and an inductor 816C (e.g., an HB inductor) configured to capacitively couple to the inductor 816B (e.g., terminals of the inductor 816C configured to capacitively couple to terminals of the inductor 816B) via a capacitor 818 and a capacitor 820. Together, the inductors 816A, 816B, and 816C may form a matching network 814

(e.g., a three-coil transformer that may perform impedance matching and frequency selection on an input signal).

The capacitor 818 is coupled to a first end of the inductor 816B at a node 831B and a first end of the inductor 816C at a node 832B, and the capacitor 820 is coupled to a second end of the inductor 816B at a node 831A and a second end of the inductor 816C at a node 832A. An amplifier 822 (e.g., including a common-source differential pair of transistors such as metal oxide semiconductor field effect transistors (MOSFETs)) may include a first input port coupled to the first end of the inductor 816B and the capacitor 818 at the node 831B, a second input port coupled to the second end of the inductor 816B and the capacitor 818 at the node 831A, and an output port that also serves as an output port 824 of the RF gain stage 800. The output port 824 includes differential outputs 826A and 826B. The inductors 816B and 816C may be capacitively coupled via a terminal at the node 831A and a terminal at the node 832A (e.g., via the capacitor 820) and via a terminal at the node 831B and a terminal at the node 832B (e.g., via the capacitor 818).

The RF gain stage 800 may also include a capacitor 828 coupled to the HB input port 806 and an HB switch 830 coupled in parallel to the capacitor 828. The differential input 808A of the HB input port 806 may be coupled to the capacitor 820 and the second end of the inductor 816C at the node 832A, and the differential input port 808B may be coupled to the capacitor 818 and the first end of the inductor 816C. at the node 832B FIG. 9 is a flowchart of a method 900 for operating the RF gain stage 800 of FIG. 8 in a LB mode or an HB mode, according to embodiments of the present disclosure. Any suitable device (e.g., a controller) that may control components of the electronic device 10, such as the processor 12, may perform the method 900. In some embodiments, the method 900 may be implemented by executing instructions stored in a tangible, non-transitory, computer-readable medium, such as the memory 14 or storage 16, using the processor 12. For example, the method 900 may be performed at least in part by one or more software components, such as an operating system of the electronic device 10, one or more software applications of the electronic device 10, and the like. While the method 900 is described using steps in a specific sequence, it should be understood that the present disclosure contemplates that the described steps may be performed in different sequences than the sequence illustrated, and certain described steps may be skipped or not performed altogether.

In process block 902, the transceiver 30 of the electronic device 10 receives an RF signal. The RF signal may include a carrier aggregation signal including an LB/HB component carriers (e.g., the LBRF signal 514 and/or the HBRF signal 522). In query block 904, the processor 12 may determine whether the RF signal is a low band signal. If the processor 12 determines that the signal is a low band signal, in process block 906, the processor 12 causes the LB switch 812 to open and causes the HB switch 830 to close. Closing the HB switch 830 may cause the inductor 816C (e.g., the HB inductor) to be pulled to ground, shorting out the HB input port 806, and causing the LB input port 802 to couple to the amplifier 822 and the output port 824 via the magnetic coupling of the inductor 816A (e.g., the LB inductor) and the inductor 816B.

Figure 10:
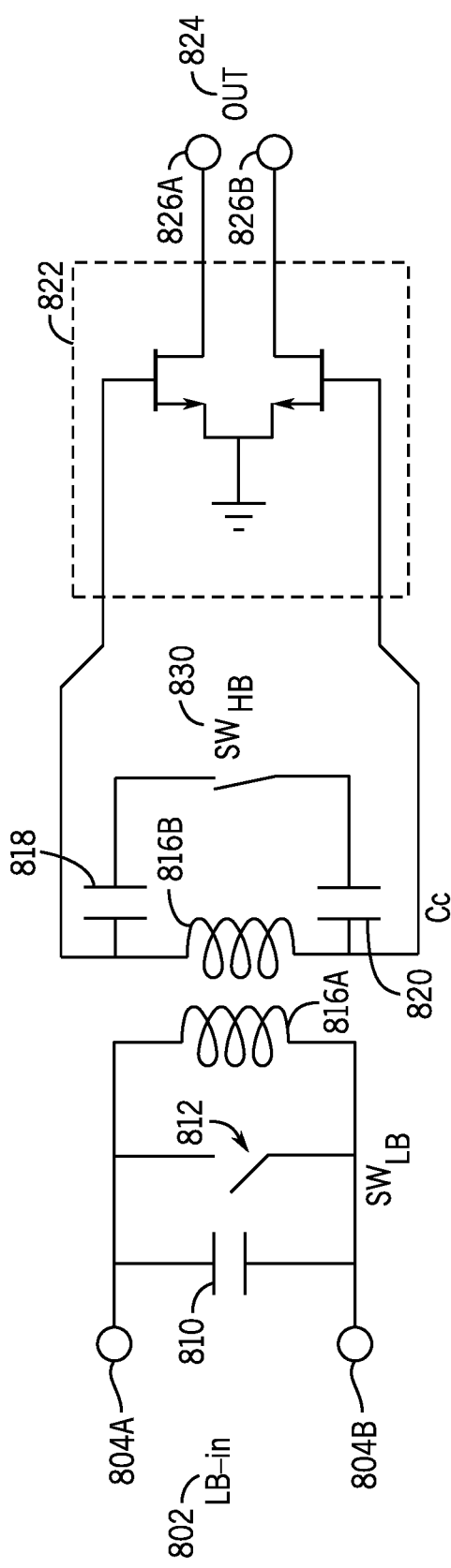
FIG. 10 is a schematic diagram of an equivalent circuit of the RF gain stage of FIG. 8 operating in the LB mode, according to embodiments of the disclosure.

FIG. 10 is a schematic diagram of an equivalent circuit 1000 of the RF gain stage 800 of FIG. 8 operating in the LB mode, according to embodiments of the present disclosure. As may be observed, the HB input port 806 and the inductor 816C are not illustrated as they are shorted out and have no or little effect on the RF gain stage 800 in the LB mode. The LB signal (e.g., the component carriers corresponding to the LBRF signal 514) may be transmitted to the amplifier 822 and the output port 824 via magnetic coupling of the inductors 816A and 816B. Returning to FIG. 9, if, at the query block 904, the processor 12 determines that the RF signal is not an LB signal (e.g., is an HB signal), then, in process block 908, the processor 12 may cause the HB switch 830 to open and cause the LB switch 812 to close, causing the inductor 816A (e.g., the LB inductor) to be pulled to ground, shorting the LB input port 804 and causing the HB input port 806 to couple to the amplifier 822 and the output port 824.

Figure 11:
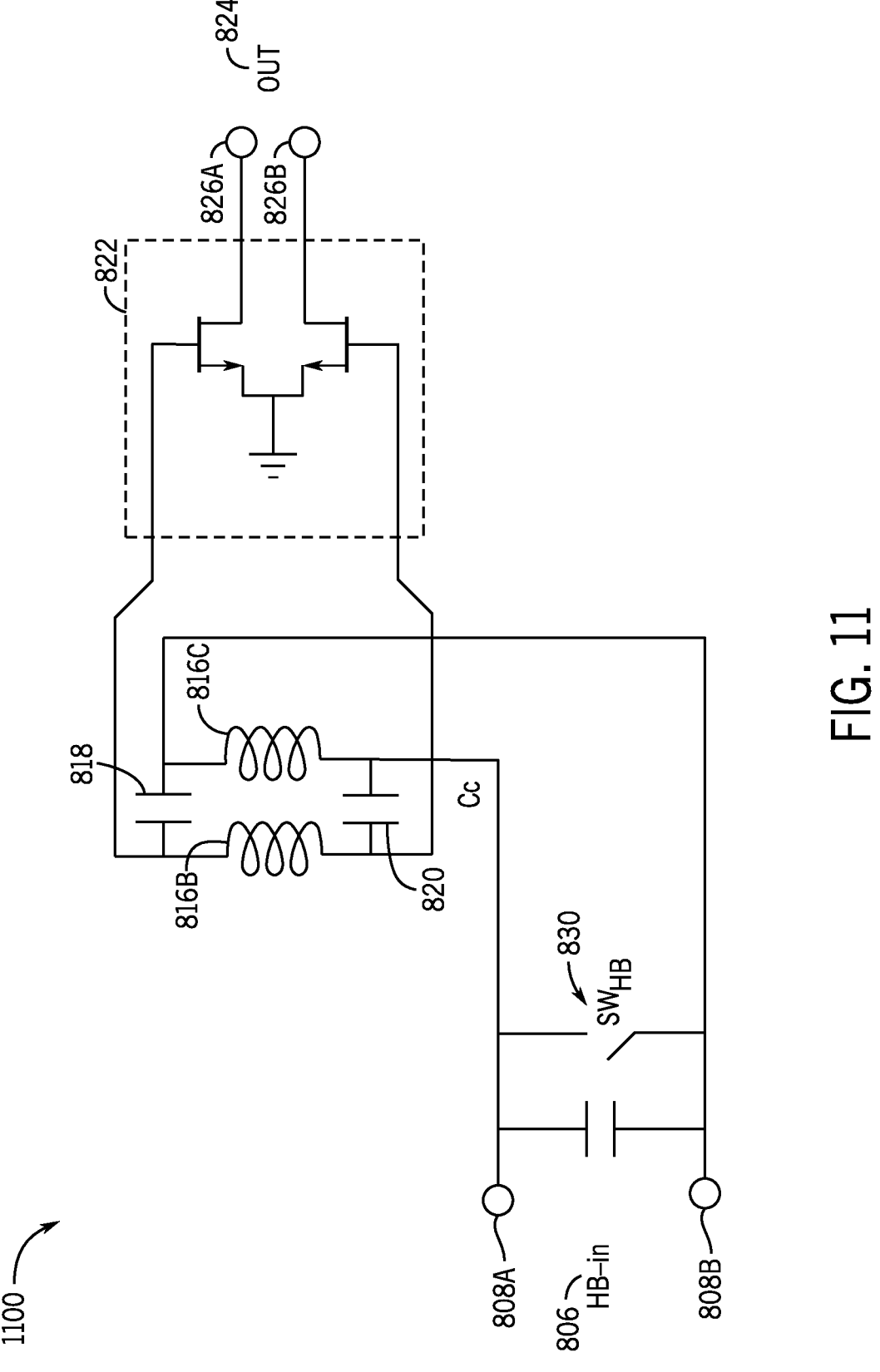
FIG. 11 is a schematic diagram of an equivalent circuit of the RF gain stage of FIG. 8 operating in the HB mode, according to embodiments of the disclosure.

FIG. 11 is a schematic diagram of an equivalent circuit 1100 of the RF gain stage 800 operating in the HB mode, according to embodiments of the present disclosure. As may be observed the LB input port 802 and the inductor 816A are not illustrated as they are shorted out and have no or little effect on the RF gain stage 800 in the HB mode. The HB signal (e.g., the components carriers corresponding to the HBRF signal 522) may be transmitted to the amplifier 822 and the output port 824 via capacitive coupling of the terminals of the nodes 831A and 831B of the inductor 816B and the terminals of the nodes 832A and 832B of the inductor 816C. In this manner, the method 900 for operating the RF gain stage 800 in the LB mode or the HB mode, which enables the benefit of the present disclosure.

Figure 12:
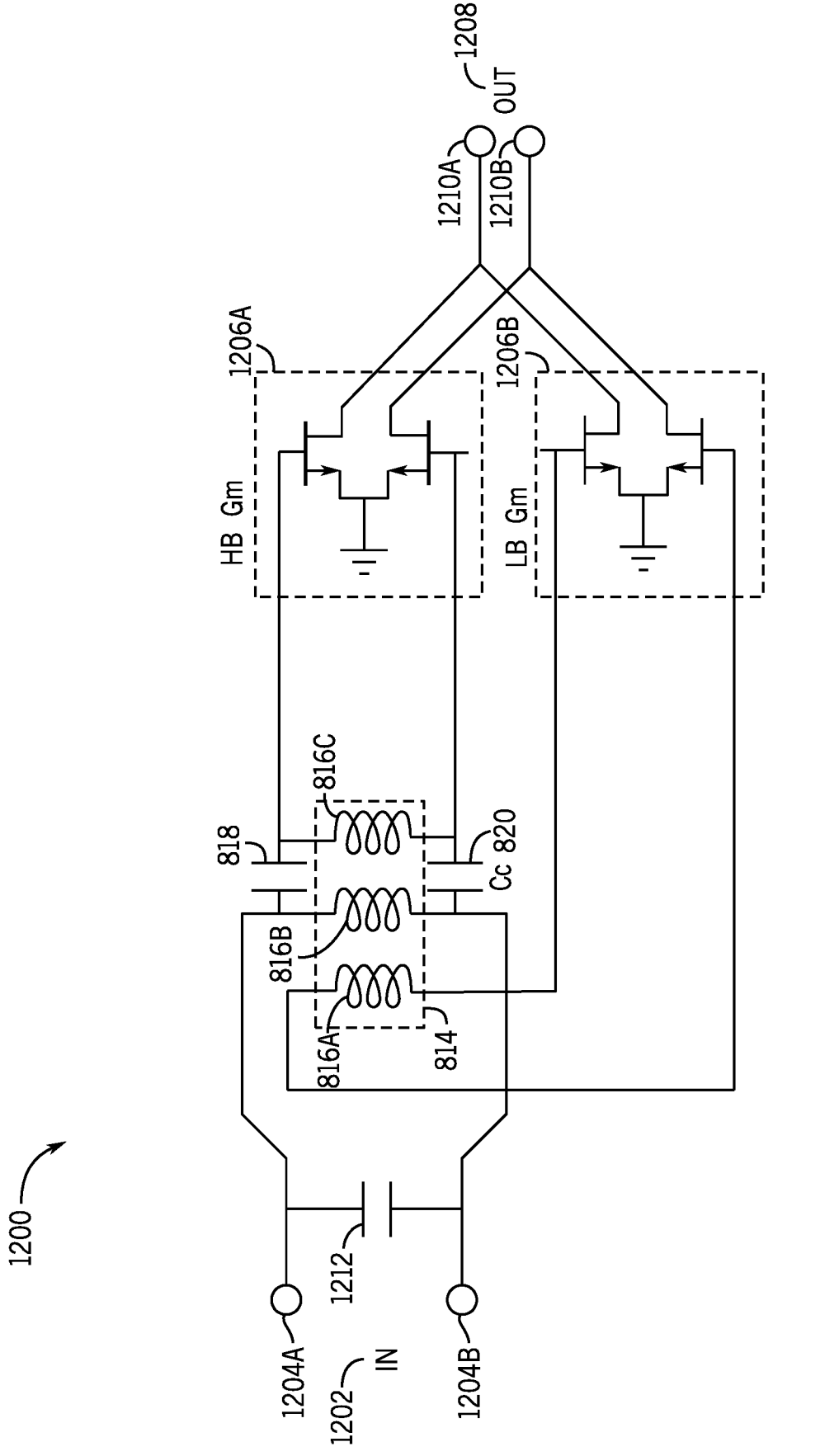
FIG. 12 is a schematic diagram of single-input port dual-band RF gain stage that may implement the carrier aggregation discussed with respect to FIG. 7, according to embodiments of the disclosure.

FIG. 12 is a schematic diagram of single-input port dual-band RF gain stage 1200 that may implement the carrier aggregation discussed with respect to FIG. 7, according to embodiments of the present disclosure. The RF gain stage 1200 may be implemented in embodiments where, for example, the LBRF signals 514 and the HBRF signals 522 comes from a single antenna and/or amplifier (e.g., a single LNA, VGA, PA, and so on). The RF gain stage 1200 may be implemented in a dual-band mixer chain (e.g., may be implemented at the RF gain stage 706 of the mixer chain 702). In some embodiments, more than one RF gain stage 1200 may be implemented in a row (e.g., such that the output of one RF gain stage 1200 feeds into an input of a subsequent RF gain stage 1200). Moreover, the RF gain stage 1200 may be implemented in a chain including one or more RF gain stages 800 (e.g., such that the output of one RF gain stage 1200 feeds into an input of a subsequent RF gain stage 800 or vice versa). The RF gain stage 1200 includes an input port 1202 including differential inputs 1204A and 1204B, an HB amplifier 1206A (e.g., including a common-source differential pair of transistors such as MOSFETs) and an LB amplifier 1206B (e.g., . . . , including a common-source differential pair of transistors such as MOSFETs) coupled to an output port 1208 including differential outputs 1210A and 1210B. The RF gain stage 1200 includes a capacitor 1212, the matching network 814 including the inductor 816A (e.g., the LB inductor), the inductor 816B, and the inductor 816C (e.g., the HB inductor). The capacitor 1212 is coupled in parallel with the inductor 816B. The inductor 816A is magnetically coupled to the inductor 816B and electrically coupled to the LB amplifier 1206B. The terminals at the nodes 832A and 832B of inductor 816C is capacitively coupled to the terminals at the nodes 831A and 831B of the inductor 816B via the capacitors 818 and 820, respectively (e.g., as described with respect to FIG. 8), and is electrically coupled to the HB amplifier 1206A. As the RF gain stage 1200 has no switches, the RF gain stage 1200 may have no switching loss.

FIG. 13 is a flowchart of a method for operating the RF gain stage of FIG. 12 in a LB mode or an HB mode, according to embodiments of the present disclosure. Any suitable device (e.g., a controller) that may control components of the electronic device 10, such as the processor 12, may perform the method 1300. In some embodiments, the method 1300 may be implemented by executing instructions stored in a tangible, non-transitory, computer-readable medium, such as the memory 14 or storage 16, using the processor 12. For example, the method 1300 may be performed at least in part by one or more software components, such as an operating system of the electronic device 10, one or more software applications of the electronic device 10, and the like. While the method 1300 is described using steps in a specific sequence, it should be understood that the present disclosure contemplates that the described steps may be performed in different sequences than the sequence illustrated, and certain described steps may be skipped or not performed altogether.

In process block 1302, the transceiver 30 of the electronic device 10 receives an RF signal. The RF signal may include a carrier aggregation signal including LB/HB component carriers. In query block 1304, the processor 12 may determine whether the RF signal is a low band signal. If the processor 12 determines that the signal is a low band signal, in process block 1306, the processor 12 causes the LB amplifier 1206B to turn on and causes the HB amplifier 1206A to turn off. Turning off the HB amplifier 1206A may cause the inductor 816C (e.g., the HB inductor) to be pulled to ground and shorted, and may cause the inductor 816A (e.g., the LB inductor) to magnetically couple to the inductor 816B, electrically coupling the input port 1202 to the output port 1208 via the LB amplifier 1206B. However, if the processor 12 determines that the signal is a high band signal, in process block 1308 the processor 12 causes the HB amplifier 1206A to turn on and causes the LB amplifier 1206B to turn off. Turning off the LB amplifier 1206B may cause the inductor 816A (e.g., the LB inductor) to be pulled to ground and shorted, and may cause the inductor 816C (e.g., the HB inductor) to capacitively couple to the inductor 816B, electrically coupling the input port 1202 to the output port 1208 via the HB amplifier 1206A.

Figure 14:
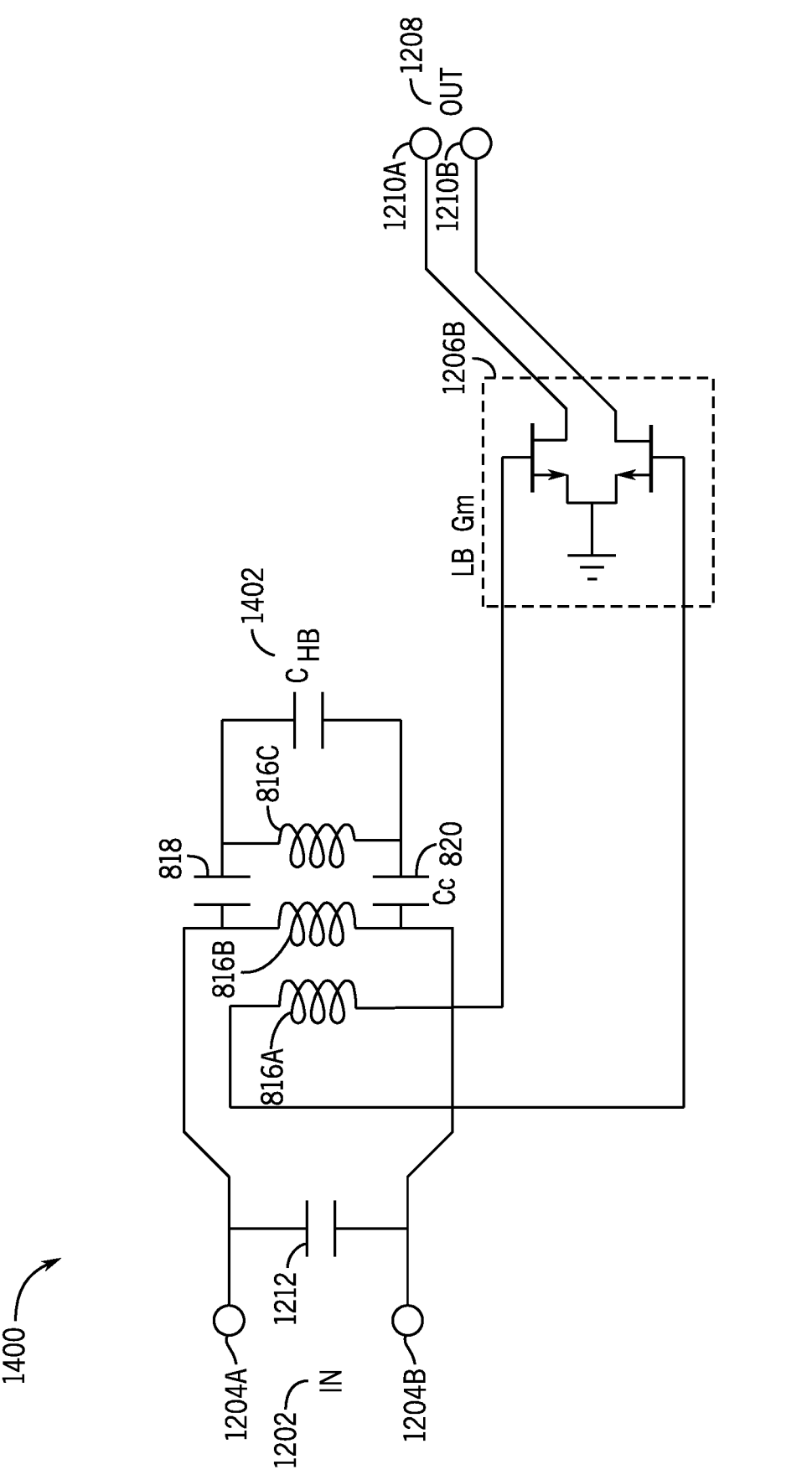
FIG. 14 is a schematic diagram of an equivalent circuit of the RF gain stage of FIG. 12 operating in the LB mode, according to embodiments of the disclosure.

FIG. 14 is a schematic diagram of an equivalent circuit of the RF gain stage 1200 of FIG. 12 operating in the LB mode, according to embodiments of the present disclosure. As may be observed, the HB amplifier 1206A and is not illustrated as it is shorted out and may have no or little effect (e.g., may effectively create a parasitic capacitance, illustrated by the HB capacitor 1402) on the RF gain stage 1200 in the LB mode. The LB signal (e.g., the component carriers corresponding to the LBRF signal 514) is transmitted to the LB amplifier 1206B and the output port 1208 via magnetic coupling of the inductors 816A and 816B. Returning to FIG. 13, if, at the query block 1304, the processor 12 determines that the RF signal is not an LB signal (e.g., is an HB signal), the processor 12 may cause the HB amplifier 1206A to turn on and the LB amplifier 1206B to turn off, causing the inductor 816A (e.g., the LB inductor) to be pulled to ground, and causing the input port 1202 to couple to the output port 1208 via the HB amplifier 1206A.

Figure 15:
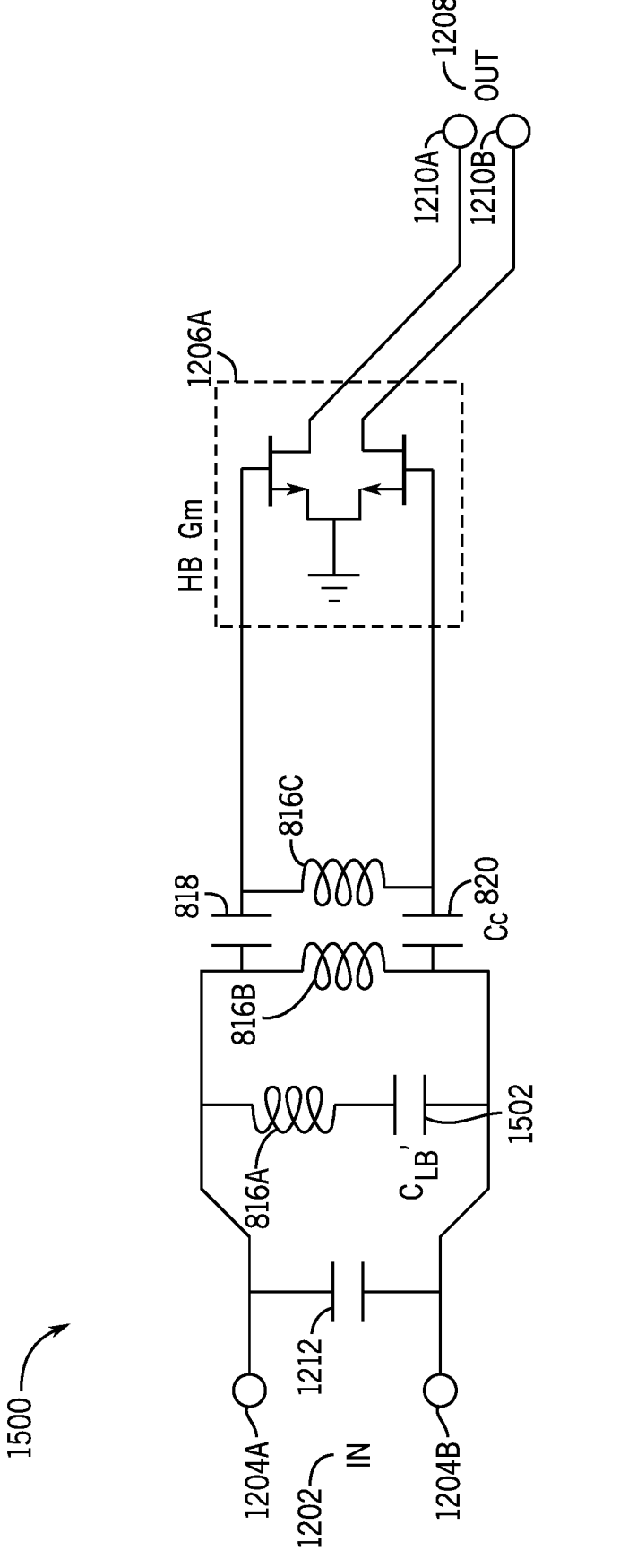
FIG. 15 is a schematic diagram of an equivalent circuit of the RF gain stage of FIG. 12 operating in the HB mode, according to embodiments of the disclosure.

FIG. 15 is a schematic diagram of an equivalent circuit of the RF gain stage 1200 of FIG. 12 operating in the HB mode, according to embodiments of the present disclosure. As may be observed, the LB amplifier 1206B is not illustrated as it is shorted out and have no or little effect on the RF gain stage 1200 in the HB mode (e.g., e.g., may effectively create a parasitic capacitance, illustrated by the LB capacitor 1502). The HB signal (e.g., the components carriers corresponding to the HBRF signal 522) is transmitted the output port 1208 via the HB amplifier 1206A due to the capacitive coupling of the terminals at the nodes 831A, 831B, 832A and 832B of the inductors 816B and 816C. In this manner, the method 1300 for operating the RF gain stage 1200 in either the LB mode or the HB mode, which enables the benefit of the present disclosure.

Figure 16:
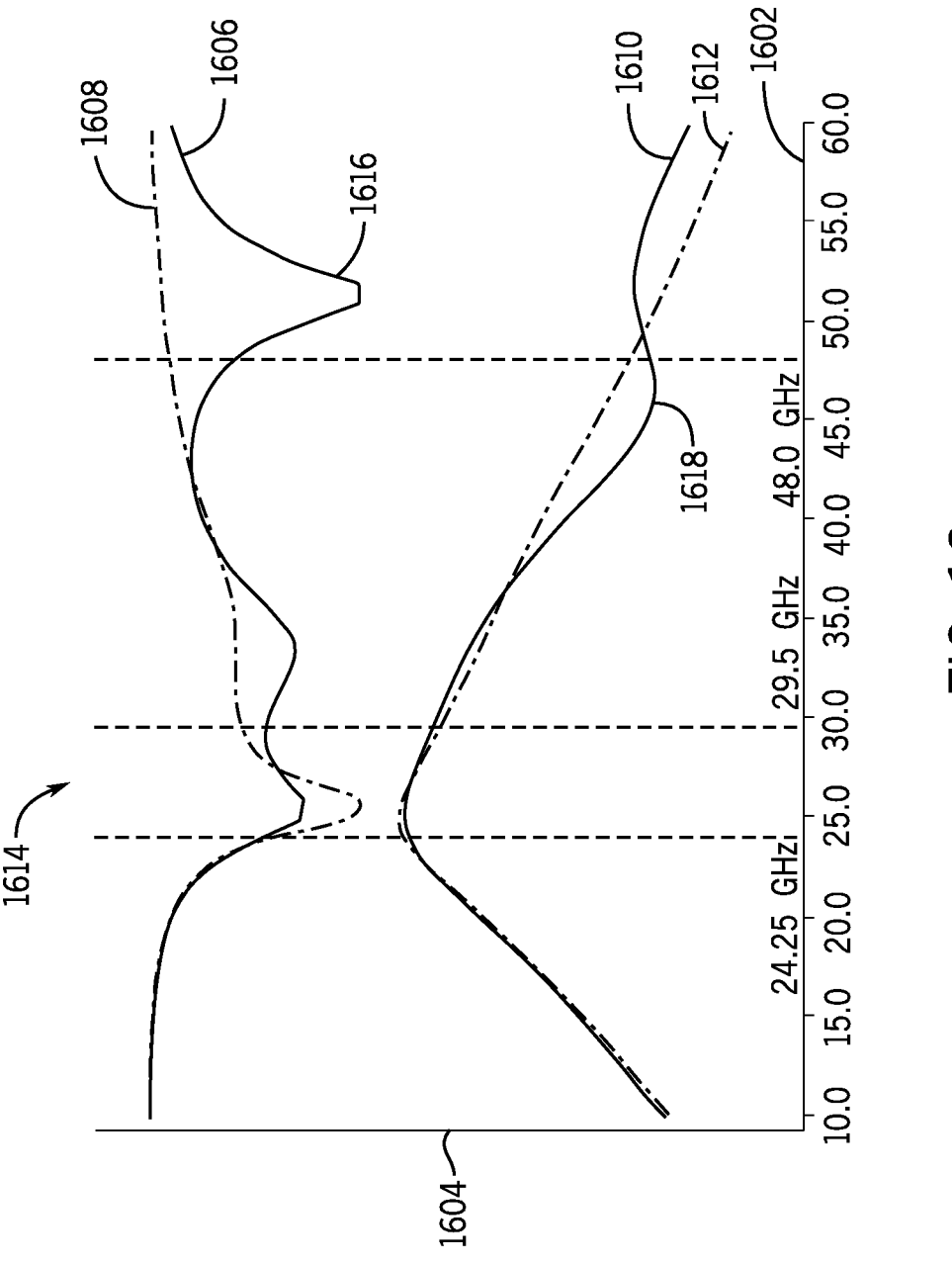
FIG. 16 is a plot illustrating performance of a dual-band RF gain stage (e.g., the RF gain stage of FIG. 12) operating in the LB mode compared to an LB-only gain stage, according to embodiments of the disclosure.

FIG. 16 is a plot illustrating performance of a dual-band RF gain stage (e.g., the RF gain stage 1200 of FIG. 12) operating in the LB mode compared to an LB-only gain stage, according to embodiments of the present disclosure. The plot includes a horizontal axis 1602 representing frequency and a vertical axis 1604 representing reflection coefficient or gain (e.g., in decibels (dB)). A dual-band gain stage curve 1606 represents the RF gain stage 1200, and an LB gain stage curve 1608 represents an LB-only gain stage (e.g., the mixer chain 502A from FIG. 5). As may be observed, the dual-band gain stage curve 1606 has a similar in-band gain in the frequency of interest 1614 (e.g., good matching in the frequency band ranging from 24.25 GHz to 29.5 GHz) and improved image rejection outside the frequency of interest 1614 (e.g., at point 1616).

The plot includes a dual-band gain stage curve 1610 and an LB (e.g., single-band) gain stage curve 1612 representing an LB-only gain stage (e.g., the mixer chain 502A from FIG. 5). As may be observed, the dual-band gain stage curve 1610 has similar in-band gain in the frequency of interest 1614 and improved image rejection outside of the frequency interest 1614 (e.g., at the point 1618).

Figure 17:
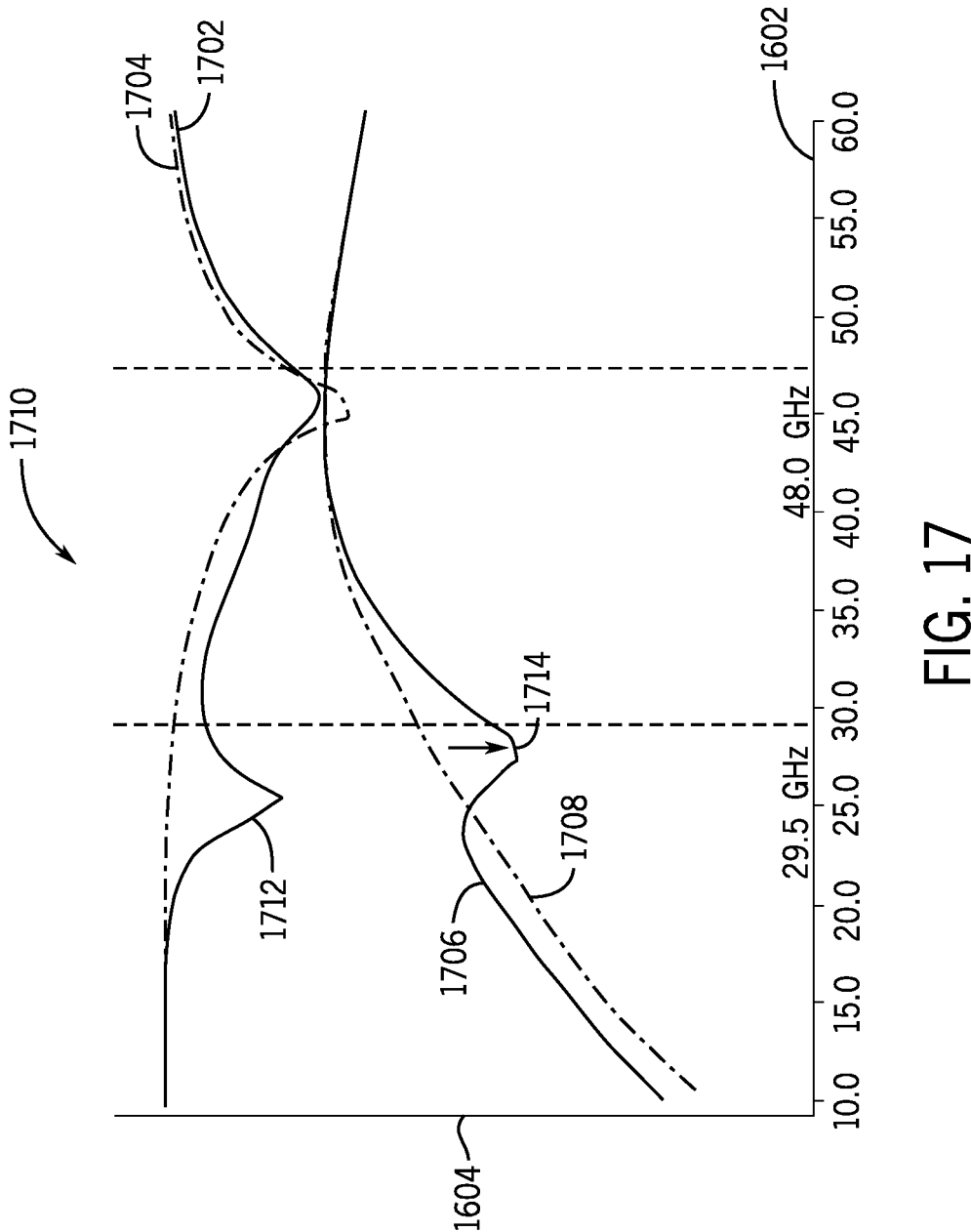
FIG. 17 is a plot illustrating performance of a dual-band RF gain stage (e.g., the RF gain stage of FIG. 12) operating in the HB mode compared to an HB-only gain stage, according to embodiments of the disclosure.

FIG. 17 is a plot illustrating performance of a dual-band RF gain stage (e.g., the RF gain stage 1200) operating in the HB mode compared to an HB-only gain stage, according to embodiments of the present disclosure. The plot includes the horizontal axis 1602 representing frequency and vertical axis 1604 representing reflection coefficient or gain. A dual-band gain stage curve 1702 represents the RF gain stage 1200 in HB mode and an HB gain stage curve 1704 represents an HB-only gain stage (e.g., the mixer chain 502D from FIG. 5). As may be observed, the dual-band gain stage curve 1702 has similar gain (e.g., good matching) to the HB gain stage curve 1704 within the frequency of interest (e.g., the frequency band ranging from 29.5 GHz to 47.2 GHz). The dual-band gain stage curve 1704 may have improved image rejection outside of the frequency of interest 1710 (e.g., at the point 1712).

The plot includes a dual-band gain stage curve 1706 representing the RF gain stage 1200 in HB mode and an HB gain stage curve 1708 representing an HB-only gain stage (e.g., the mixer chain 502D from FIG. 5). As may be observed, the dual-band gain stage curve 1706 has similar gain (e.g., good matching) to the HB gain stage curve 1708 within the frequency of interest 1710 while having improved image rejection outside of the frequency of interest 1710 (e.g., at the point 1714).

It should be noted that, while the matching network 814 is discussed as being included in a gain stage, in some embodiments the matching network 814 may be included in a mixer.

In an embodiment, a transceiver may include a mixer; and a gain stage coupled to the mixer. The gain stage may include a first input port that may receive a first signal including a first frequency and a second input port that may receive a second signal including a second frequency, and a matching network that may couple to the first input port and the second input port and perform impedance matching on the first signal and the second signal, and including a first inductor, a second inductor that may couple to the first inductor based the first signal, and a third inductor configured to couple to the first inductor based on the second signal.

The transceiver may include processing circuitry that may cause the first input port to electrically couple to an output port of the gain stage by coupling the first inductor to the second inductor based on the first signal.

Wherein the processing circuitry may cause the first input port to electrically couple to the output port by opening a first switch of the gain stage electrically coupled to the first input port and closing a second switch of the gain stage electrically coupled to the second input port.

The transceiver may include processing circuitry that may cause the second input port to electrically couple to an output port by coupling the first inductor to the third inductor based on the second signal.

Wherein the processing circuitry may cause the second input port to electrically couple to the output port by opening a first switch of the gain stage electrically coupled to the second input port and closing a second switch of the gain stage electrically coupled to the first input port.

The transceiver may include an amplifier coupled to the first inductor, the amplifier configured to drive the first signal, the second signal, or both to a differential output port of the gain stage.

In another embodiment, a method may include receiving a signal, at a receiver of an electronic device; magnetically coupling a first inductor of a gain stage of the electronic device to a second inductor of the gain stage based on the signal including a first frequency; electrically coupling, via a first switch, a first input of the gain stage to an output of the gain stage based on the first signal including the first frequency; capacitively coupling a first terminal of a third inductor of the gain stage to a second terminal of the second inductor based on the signal including a second frequency; and electrically coupling via a second switch, a second input of the gain stage to the output of the gain stage based on the signal including the second frequency.

Wherein the first inductor may magnetically couple to the second inductor based on the first switch of the gain stage opening and the second switch of the gain stage closing.

Wherein the first switch opening and the second switch closing causes the first input to electrically couple to an amplifier, the amplifier configured to receive the signal including the first frequency.

Wherein the third inductor is configured to capacitively couple to the second inductor by based on the second switch of the gain stage opening and the first switch closing.

Wherein the second switch opening and the second switch closing causes the second input to electrically couple to an amplifier, the amplifier configured to receive the signal including the second frequency.

Wherein the first inductor, the second inductor, and the third inductor include an impedance matching network.

Wherein the first input is configured to receive the signal including the first frequency from a first set of antennas and the second input is configured to receive the signal including the second frequency from a second set of antennas.

In yet another embodiment, A device, may include a first input configured to receive a first signal including a first frequency; a second input configured to receive a second signal including a second frequency; a first inductor electrically coupled to an output of the gain stage; a second inductor configured to magnetically couple to the first inductor based on the first input receiving the first signal; and a first terminal of a third inductor configured to capacitively couple to a second terminal of the first inductor based on the second input receiving the second signal.

Wherein the device may include a processor that may cause the first input to electrically couple to the output by magnetically coupling the first inductor to the second inductor based on the first input receiving the first signal.

Wherein the processor may cause the first input to electrically couple to the output by opening a first switch, the first switch electrically coupled to the first input, and closing a second switch, the second switch electrically coupled to the second input.

Wherein the device may include a processor that may cause the second input to electrically couple to the output by capacitively coupling the second terminal of the first inductor to the third terminal of the third inductor based on the second input receiving the second signal.

And wherein the processor may cause the second input to electrically couple to the output by opening a first switch, the first switch electrically coupled to the second input, and closing a second switch, the second switch electrically coupled to the first input.

In yet another embodiment, 19. A transceiver includes a local oscillator; a gain stage; a mixer coupled to the local oscillator and the gain stage, the mixer configured to receive, from the gain stage, a first signal including a first frequency, receive, from the gain stage, a second signal including a second frequency, and enable dual-band carrier aggregation for a first set of component carriers associated with the first signal and a second set of component carriers associated with the second signal.

Wherein the first frequency includes a frequency at least 5 gigahertz greater than the second frequency.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. A transceiver, comprising:
a mixer;
a local oscillator coupled to the mixer; and
a gain stage coupled to the mixer, the gain stage comprising
an input port configured to receive a signal, and

US 12,603,663 B2

17 a matching network comprising
    a first inductor,
    a second inductor coupled to a first amplifier, the first
        amplifier coupled to an output port of the gain
        stage, and the second inductor configured to
        couple to the first inductor based on the signal
        comprising a first frequency and based on activat-
        ing the first amplifier and deactivating a second
        amplifier, and
    a third inductor coupled to the second amplifier, the
        second amplifier coupled to the output port of the
        gain stage, and the third inductor configured to
        couple to the first inductor based on the signal
        comprising a second frequency and based on
        activating the second amplifier and deactivating
        the first amplifier.
2. The transceiver of claim 1, comprising processing
circuitry configured to activate the first amplifier and deac-
tivate the second amplifier based on the signal comprising
the first frequency.
3. The transceiver of claim 2, wherein the third inductor
is configured to short circuit based on the processing cir-
cuitry activating the first amplifier and deactivating the
second amplifier.
4. The transceiver of claim 1, wherein the first frequency
is less than 47 gigahertz.
5. The transceiver of claim 1, comprising processing
circuitry configured to activate the second amplifier and
deactivate the first amplifier based on the signal comprising
the second frequency.
6. The transceiver of claim 5, wherein the second inductor
is configured to short circuit based on the processing cir-
cuitry activating the second amplifier and deactivating the
first amplifier.
7. The transceiver of claim 1, wherein the first frequency
is greater than 47 gigahertz.
8. The transceiver of claim 1, wherein the first amplifier,
the second amplifier, or both comprise a common-source
differential transistor pair.
9. A method, comprising:
    receiving a first signal and a second signal at a receiver of
        an electronic device;
    magnetically coupling a first inductor of a gain stage of
        the electronic device to a second inductor of the gain
        stage based on the first signal comprising a first fre-
        quency and based on activating a first amplifier of the
        gain stage and deactivating a second amplifier of the
        gain stage, the second inductor coupled to the first
        amplifier, and the first amplifier coupled to an output
        port of the gain stage; and
    capacitively coupling a third inductor of the gain stage to
        the second inductor based on the second signal com-
        prising a second frequency and based on activating the second amplifier and deactivating the first amplifier, the
third inductor coupled to the second amplifier, and the
second amplifier coupled to the output port.
10. The method of claim 9, wherein the first inductor, the
second inductor, and the third inductor comprise an imped-
ance matching network.
11. The method of claim 9, wherein activating the first
amplifier and deactivating the second amplifier causes the
third inductor to pull to ground.
12. The method of claim 9, wherein activating the second
amplifier and deactivating the first amplifier causes the first
inductor to pull to ground.
13. The method of claim 9, wherein the first signal and the
second signal are received at the receiver from a shared set
of antennas.
14. A device, comprising:
    an input configured to receive a signal;
    a first inductor;
    a second inductor coupled to a first amplifier, the first
        amplifier coupled to an output port of a gain stage, and
        the second inductor configured to magnetically couple
        to the first inductor based on the signal comprising a
        first frequency and based on activating the first ampli-
        fier and deactivating a second amplifier; and
    a third inductor coupled to the second amplifier, the
        second amplifier coupled to the output port of the gain
        stage, and the third inductor configured to capacitively
        couple to the first inductor based on the signal com-
        prising a second frequency and based on activating the
        second amplifier and deactivating the first amplifier.
15. The device of claim 14, wherein the first inductor, the
second inductor, and the third inductor comprise an imped-
ance matching network.
16. The device of claim 14, wherein the input is config-
ured to receive the signal comprising the first frequency and
the signal comprising the second frequency from a shared
set of antennas.
17. The device of claim 14, wherein activating the first
amplifier and deactivating the second amplifier is configured
to cause the third inductor to short.
18. The device of claim 14, wherein activating the second
amplifier and deactivating the first amplifier is configured to
cause the second inductor to short.
19. The device of claim 14, wherein the first frequency is
between 24 gigahertz and 30 gigahertz, and the second
frequency is greater than 47 gigahertz.
20. The device of claim 14, wherein the first amplifier and
the second amplifier each comprise a common-source dif-
ferential transistor pair.

*    *    *    *    *